US008487670B2

(12) United States Patent
Fagg

(10) Patent No.: US 8,487,670 B2
(45) Date of Patent: Jul. 16, 2013

(54) DIVIDE-BY-TWO INJECTION-LOCKED RING OSCILLATOR CIRCUIT

(75) Inventor: Russell J. Fagg, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/553,498

(22) Filed: Sep. 3, 2009

(65) Prior Publication Data

US 2011/0050296 A1    Mar. 3, 2011

(51) Int. Cl.
    *H03B 19/06*     (2006.01)
(52) U.S. Cl.
    USPC ............ 327/118; 327/114; 327/115; 327/117
(58) Field of Classification Search
    USPC ................ 327/115, 116, 117, 118, 355–361,
         327/202, 203, 208–212, 218, 108–112, 379,
         327/389, 391; 377/47, 48; 326/22–27, 81–87;
                                                    331/57
    See application file for complete search history.

(56) References Cited

U.S. PATENT DOCUMENTS

| | | | |
|---|---|---|---|
| 7,062,247 B2 * | 6/2006 | Kovacevic et al. ............ | 455/323 |
| 7,375,596 B2 * | 5/2008 | Park et al. ........................ | 331/45 |
| 7,521,976 B1 | 4/2009 | Sudjian et al. | |
| 7,557,664 B1 | 7/2009 | Wu | |
| 7,755,442 B2 * | 7/2010 | Li et al. .......................... | 331/167 |
| 8,212,592 B2 | 7/2012 | Fagg | |
| 2002/0008590 A1 * | 1/2002 | Van Der Tang et al. ........ | 331/45 |
| 2004/0066241 A1 * | 4/2004 | Gierkink et al. ................ | 331/46 |
| 2004/0251227 A1 | 12/2004 | Perkins et al. | |
| 2005/0110579 A1 | 5/2005 | Raha | |
| 2005/0253659 A1 * | 11/2005 | Favrat et al. ..................... | 331/57 |
| 2006/0208818 A1 * | 9/2006 | Lee et al. ........................ | 331/167 |
| 2007/0030090 A1 | 2/2007 | Farnworth | |
| 2009/0072917 A1 * | 3/2009 | Yajima et al. ............. | 331/108 R |
| 2009/0115540 A1 | 5/2009 | Shen | |
| 2009/0134947 A1 | 5/2009 | Tarng | |
| 2009/0251227 A1 | 10/2009 | Jasa et al. | |

OTHER PUBLICATIONS

Written Opinion—PCT/US2010/047877—ISA/EPO—Nov. 24, 2010.
International Search Report—PCT/US2010/047877—ISAEPO—Nov. 24, 2010.
Leung, Lincoln L. K. et al: "A 1-V, 9.7mW CMOS Frequency Synthesizer for WLAN 802.11a Transceivers," 2005 Symposium on VLSI Circuits Digest of Technical Papers. Piscataway, NJ, USA, (Jun. 16, 2005), pp. 252-255, XP010818423, DOI:10.1109/VLSIC.2005.1469379, ISBN: 978-4-900784-01-7.

(Continued)

*Primary Examiner* — Lincoln Donovan
*Assistant Examiner* — Brandon S Cole
(74) *Attorney, Agent, or Firm* — Ramin Mobarhan

(57) ABSTRACT

A frequency divider involves a plurality of Injection-locked Ring Oscillators (ILRO). A first ILRO includes a pair of cross-coupled N-channel transistors, a pair of load resistors, an integrating capacitor, and a current injection circuit. The drain of each transistor is coupled to the gate of the other transistor. Each load resistor couples the drain of each transistor to a circuit voltage source. The integrating capacitor couples the sources of each transistor. The current injection circuit alternately opens and closes a path from the source of each transistor to circuit ground in response to an oscillatory input signal of a first frequency. In response, the voltage state at the drain of each transistor is alternately latched and toggled, generating a differential pair of oscillating signals frequency divided by two. A first and second ILRO driven in antiphase generate two differential output signals in phase quadrature.

22 Claims, 11 Drawing Sheets

FREQUENCY DIVIDER IN A FIRST EMBODIMENT

OTHER PUBLICATIONS

Mazzanti A, et al., "Injection locked oscillators for quadrature generation radio frequency", Microelectronics, 2004. ICM 2004 Proceedings. The 16th International Conference on Tunis, Tunisia Dec. 6-8, 2004, Piscataway, NJ, USA,IEEE, Dec. 6, 2004, pp. 124-127, XP010800749, DOI: D0I:10.1109/ICM.2004.1434224 ISBN: 978-0-7803-8656-3.

Shao-Hua Lee, et al., "A Low Voltage Divide-by-4 Injection Locked Frequency Divider With Quadrature Outputs", IEEE Microwave and Wireless Components Letters, IEEE Service Center, New York, NY, US, vol. 16, No. 5, May 1, 2007, pp. 373-375, XP011180011, ISSN: 1531-1309.

Shibasaki T, et al., "20-GHz Quadrature Injection-Locked LC Dividers With Enhanced Locking Range", IEEE Journal of Solid-State Circuits, IEEE Service Center, Piscataway, NJ, US, vol. 43, No. 3, Mar. 1, 2008, pp. 610-618, XP011204874, ISSN: 0018-9200, Mar. 2008

618, XP011204874, ISSN: 0018-9200, Mar. 2008.

* cited by examiner

ILRO IN A LATCH STATE - OSCILLATORY INPUT SIGNAL HIGH

ILRO IN A TOGGLE STATE - OSCILLATORY SIGNAL INPUT LOW

ILRO IN A LATCH STATE - OSCILLATORY INPUT SIGNAL HIGH

ILRO IN A TOGGLE STATE - OSCILLATORY INPUT SIGNAL LOW

EXEMPLARY INPUT AND OUTPUT WAVEFORMS OF FREQUENCY
DIVIDER IN A FIRST EMBODIMENT

FREQUENCY DIVIDER IN A SECOND EMBODIMENT

FREQUENCY DIVIDER IN A THIRD
EMBODIMENT- DIVIDE BY FOUR OPERATION

FREQUENCY DIVIDER IN A FOURTH EMBODIMENT

DIVIDE-BY-TWO INJECTION-LOCKED RING OSCILLATOR CIRCUIT

BACKGROUND INFORMATION

1. Technical Field

The disclosed embodiments relate generally to frequency dividers, including frequency dividers operable in wireless communication systems.

2. Background Information

For some applications, such as wireless communication systems it is useful to include a frequency divider circuit. In one example, a frequency divider receives an oscillatory input signal, frequency divides the input signal, and generates a divided-down oscillatory output signal. The frequency division is characterized as frequency division by an integer. Within a wireless communication system, frequency dividers see frequent use as part of a radio transceiver (transmitter/receiver). In one example within a radio transceiver, a frequency divider may be used to receive an oscillatory signal from a Local Oscillator (LO), divide-down the oscillatory signal in frequency, and generate two lower frequency output signals: a differential in-phase (I) output signal and a differential quadrature (Q) output signal. The frequencies of output signals I and Q may, for example, be half the frequency of the input signal. The Q output signal is of the same frequency as the I output signal, but shifted ninety degrees in phase with respect to the I output signal. As such, differential output signals I and Q are said to be in phase quadrature. The set of divided-down output signals may, for example, be supplied to a mixer in a receive chain of the radio transceiver. This is but one application of a frequency divider within a wireless communication system. Frequency dividers may also see use within a Phase-Locked Loop within a local oscillator, or may also be used to frequency divide signals in other places within the wireless communication system circuitry.

FIG. 1 (Prior Art) is a diagram of a type of frequency divider circuit 1. Frequency divider 1 includes two conventional Injection-locked Frequency Dividers (ILFD) 2 and 3. Frequency divider 1 receives a differential input signal LO involving signal LO+ on conductor 4 and signal LO- on conductor 5. Divider 1 generates two differential output signals, I and Q. Differential output signal I involves signal I+ on conductor 6 and signal I- on conductor 7. Differential output signal Q involves signal Q+ on conductor 8 and signal Q- on conductor 9. Both ILFD 2 and 3 are a type of oscillatory circuit. For example, if an input signal of constant voltage is applied to ILFD 2, it will simply oscillate at its own natural frequency. However, if an oscillatory input signal of sufficient amplitude that falls within an acceptable frequency window is applied to ILFD 2, it will "lock" to the frequency of the oscillatory input signal and oscillate at half of the frequency of the oscillatory input signal. Thus, frequency divider 2 is operable to frequency divide input signal LO by integer two and generate output signals in phase quadrature. Although, the circuit of FIG. 1 operates satisfactorily in some applications, it has limitations. Due to the use of inductive loads, the physical size of a conventional ILFD is undesirably large. In addition, the inductors act as both a transmitter and receiver of Electro-Magnetic Interference (EMI) within the context of a larger circuit. Thus, the inductors inhibit the performance of other circuit elements and the performance of frequency divider 1 is inhibited by other circuit elements. In addition, the range of input frequencies to which the conventional ILFD will reliably "lock", and hence divide, is limited to a relatively small percentage of the center tuned input frequency for typical input signal amplitudes. A broader range can be achieved by increasing the input signal amplitude or reducing the inductor quality factor but this approach consumes more power. An elaborate digitally controlled capacitor tuning bank may be employed to broaden the effective range of the ILFD to a practical range of 30-40% of the center tuned input frequency, but this approach is undesirably complex and consumes die area.

FIG. 2 (Prior Art) is a diagram of another type of frequency divider circuit 10. Frequency divider 10 includes two cross-coupled Common Mode Logic (CML) circuits 11 and 12. Frequency divider 10 receives a differential input signal LO involving signal LO+ on conductor 13 and signal LO- on conductor 14. Divider 10 generates two pairs of differential output signals, I and Q. Differential output signal I involves signal I+ on conductor 15 and signal I- on conductor 16. Differential output signal Q involves signal Q+ on conductor 17 and signal Q- on conductor 18. CML circuit 11 includes transistors TR1-TR6. LO- is supplied to transistor TR3 and LO+ is supplied to transistor TR4. Transistors TR1 and TR2 sense the state of CML circuit 12 and transfer this state to the load resistors of CML circuit 11 when TR3 is clocked high by LO-. When TR3 is clocked low by LO- and TR4 is clocked high by LO+, transistors TR5 and TR6 latch the state of the resistors of CML 11 during this phase of the clock cycle. In this manner, output signals I+ and I- oscillate at half the frequency of LO. Similarly, output signals Q+ and Q- oscillate at half the frequency of LO. However, since CML 12 receives LO+ and LO- in opposite polarity compared to CML 11, the differential output pair (Q+, Q-) and the differential output pair (I+, I-) are in phase quadrature. A limitation of frequency divider 10 is that the output voltage swing of the divider is not rail to rail. In practice, the low output swing of frequency divider 10 may only reach a few hundred millivolts above ground (VSS). As a result of this reduced range, phase noise performance of the divider is low relative to other solutions. In addition, a rail to rail converter must be employed to interface frequency divider 10 with inverter type passive mixer buffer stages. Rail to rail converters consume a large amount of power in the frequency range of hundreds of megahertz to a few gigahertz.

Another type of frequency divider is a dynamic logic divider utilizing transistor-based inverters. Unfortunately, the inverters require relatively high voltage supply rails to divide. In practice, a supply voltage greater than two threshold voltages plus two drain-source saturation voltages is needed for the inverter to have enough gain to operate reliably. A second disadvantage is that a dynamic logic divider requires a rail to rail input signal to divide. In practical circuit design, the input signal from a local oscillator is communicated over a signal line that often exceeds one millimeter in length. Over this distance, power losses along the line tend to attenuate the amplitude of the oscillatory signal. To overcome these losses and deliver a rail to rail signal to the divider, a more powerful signal must be transmitted by the local oscillator, resulting in undesirable levels of power consumption. In applications such as in a radio transceiver of a battery powered cellular telephone, it may be desired to operate a frequency divider that receives attenuated oscillatory input signals and generates low phase noise, rail to rail I and Q signals with minimal power consumption.

SUMMARY

A frequency divider involves an Injection-locked Ring Oscillator (ILRO). In one embodiment, the frequency divider involves two ILROs. The frequency divider receives a differential input signal, divides the input signal in frequency by the integer two, and outputs two differential output signals. A first of the differential signals is an in-phase (I) differential signal generated by a first ILRO. A second of the differential signals is a quadrature (Q) differential output signal generated by a second ILRO. The I and Q signals are approximately ninety degrees out of phase with one another, and thus are in phase quadrature.

Each ILRO includes a cross-coupled transistor pair, a load resistor corresponding with each transistor of the cross-coupled transistor pair, an integrating capacitor, and a current injection circuit. The I differential output signal is present between the drains of the cross-coupled transistor pair of the first ILRO. The Q differential output signal is present between the drains of the cross-coupled transistor pair of the second ILRO. Within each ILRO, the drain of each transistor is coupled to the gate of the respective transistor of the cross-coupled transistor pair. A load resistor is coupled between a circuit voltage source and the drain of each transistor. The integrating capacitor couples the sources of each transistor. The current injection circuit alternately opens and closes a path from the source of each transistor to circuit ground in response to an oscillatory input signal of a first frequency. In response, the voltage state at the drain of each transistor is alternately latched and toggled, generating a differential pair of oscillating output signals frequency divided by two. In this manner, two ILROs driven in antiphase by the differential input signal, generate the two differential output signals, I and Q.

In a second embodiment, a frequency divider receives a single ended input signal, divides the input signal in frequency by the integer two, and outputs two differential output signals, I and Q, in phase quadrature. In this embodiment, the frequency divider includes a single ILRO. The differential output signal, I, present between the drains of the cross-coupled transistor pair is approximately ninety degrees out of phase with a differential signal present between the sources of the cross-coupled transistor pair. Thus, the differential signal present between the sources of the cross-coupled transistor pair approximates differential quadrature signal, Q.

In a third embodiment, a frequency divider performs a divide by four operation in frequency. In this embodiment, a single ended input signal is divided down in frequency by two by a first ILRO. The output signal present at the drains of each transistor of the cross-coupled transistor pair of the first ILRO is communicated to the input of a second and third ILRO, respectively. Thus, the second and third ILROs are driven in antiphase by a differential, divided-down input signal. The second and third ILROs frequency divide the divided-down input signal by two and generate two differential output signals. I and Q. In this embodiment, the input signal to the frequency divider has been divided down in frequency by four. The first ILRO frequency divides the input signal by two and the second and third ILROs frequency divide by two again and generate phase quadrature output signals.

In a fourth embodiment, a frequency divider with improved output signal slew rate is realized. In this embodiment, the frequency divider involves two ILROs. The frequency divider receives a differential input signal, divides the input signal in frequency by the integer two, and outputs two differential output signals, I and Q, in phase quadrature. An Alternating Current (AC) coupling capacitor couples the source of the first transistor of the cross-coupled pair of the first ILRO to the gate of a third transistor. The source of the third transistor is coupled to a current source. The drain of the third transistor is coupled to the drain of the first transistor of the cross-coupled transistor pair of the second ILRO. In this manner, the signal present at the source of the first transistor is inverted, amplified, and supplied to the first output node of the second ILRO. Thus, the first load resistor of the second ILRO is driven by two transistors, improving the slew rate of the output signal present on the first node of the second ILRO. In addition, both components of the differential input signal drive the output signal present on the first node of the second ILRO. This improves divider performance in the face of input noise and device mismatches. In an analogous manner, the source of each transistor of the cross-coupled transistor pair of each ILRO are coupled to the drains of the cross-coupled transistor pair of the opposite ILRO, respectively. Thus, the performance advantages are realized in the differential output signals, I and Q of the frequency divider.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 3:
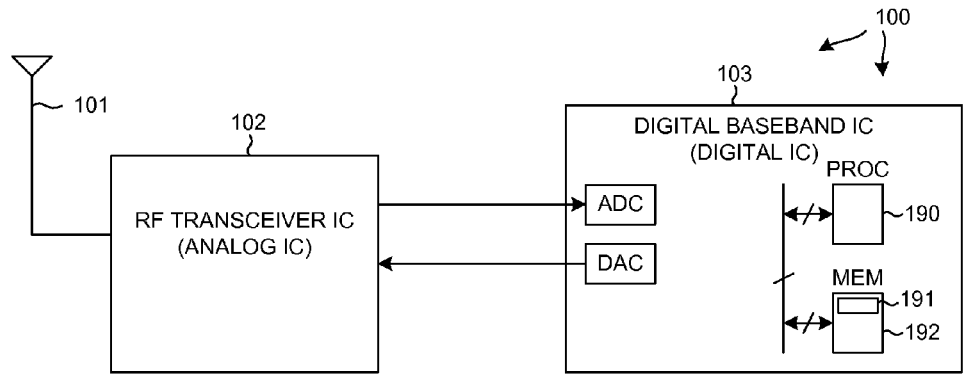
FIG. 3 is a simplified diagram of a mobile communication device 100 that employs an Injection-locked Ring Oscillator (ILRO) in accordance with one novel aspect.

FIG. 3 is a very simplified high level block diagram of a mobile communication device 100 such as a cellular telephone. Device 100 includes (among other parts not illustrated) an antenna 101 usable for receiving and transmitting cellular telephone communications, an RF transceiver integrated circuit 102, and a digital baseband integrated circuit 103.

Figure 4:
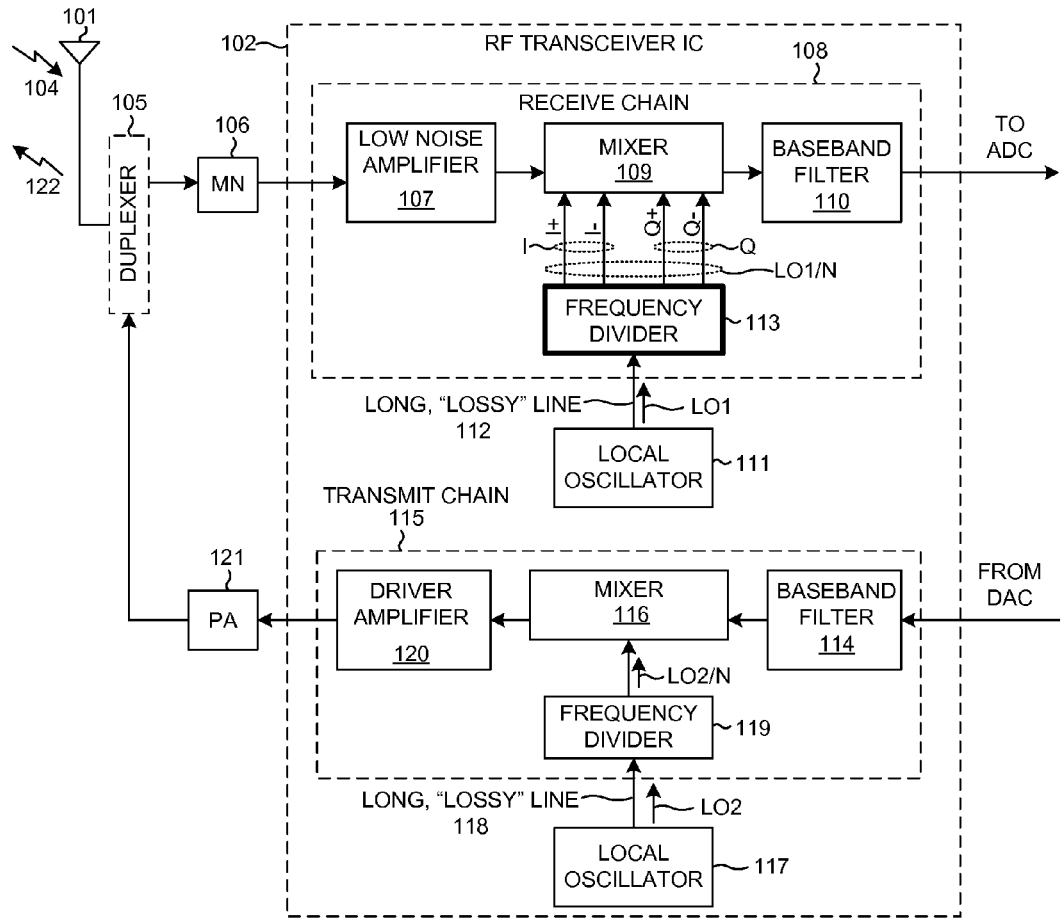
FIG. 4 is a more detailed diagram of RF transceiver integrated circuit 102 of FIG. 3.

FIG. 4 is a more detailed diagram of the RF transceiver integrated circuit 102 of FIG. 3. In one very simplified explanation of the operation of the cellular telephone, if the cellular telephone is being used to receive audio information as part of a cellular telephone conversation, then an incoming transmission 104 is received on antenna 101. The signal passes through duplexer 105 and a matching network 106 and is amplified by a Low Noise Amplifier (LNA) 107 of a receive chain 108. After being downconverted in frequency by a mixer 109 and after being filtered by baseband filter 110, the information is communicated to the digital baseband integrated circuit 103 for analog-to-digital conversion and further processing in the digital domain. As part of the downconversion process, mixer 109 receives a divided-down oscillatory signal LO1/N generated by frequency divider 113 and uses this signal to downconvert information processed by the receive chain 108. What is referred to as divided-down oscillatory signal LO1/N actually includes two differential signals, I and Q. Each of differential signals I and Q is communicated across a set of two conductors. Frequency divider 113 is in close physical proximity to the circuitry of receive chain 108. Frequency divider 113 receives a local oscillator signal LO1, divides the signal in frequency by an integer N, and outputs divided-down oscillatory signal LO1/N. Local oscillator signal LO1 is generated by local oscillator 111. LO1 may, for example, be a differential signal transmitted over two conductors. In other examples, LO1 may be a single ended signal transmitted over a single conductor. LO1 is transmitted over a long, "lossy" line 112 to frequency divider 113. As explained below, signal LO1 suffers parasitic power losses during transmission across long, "lossy" line 112. These losses attenuate the peak to peak signal amplitude of LO1 and high frequency components of LO1.

If, on the other hand, the cellular telephone 100 is being used to transmit audio information as part of a cellular telephone conversation, then the audio information to be transmitted is converted into analog form in digital baseband integrated circuit 103. The analog information is supplied to a baseband filter 114 of a transmit chain 115 of RF transceiver integrated circuit 102. After filtering, the signal is upconverted in frequency by mixer 116. As part of the upconversion process, mixer 116 receives a divided-down oscillatory signal LO2/N generated by frequency divider 119 and uses this signal to upconvert information processed by the transmit chain 115. The resulting upconverted signal is amplified by a driver amplifier 120 and an external power amplifier 121. The amplified signal is supplied to antenna 101 for transmission as outgoing transmission 122. Divided-down oscillatory signal LO2/N includes two differential signals, I and Q. Frequency divider 119 receives a local oscillator signal LO2, divides the signal in frequency by an integer divisor N, and outputs divided-down oscillatory signal LO2/N. Local oscillator signal LO2 is generated by local oscillator 117. LO2 may, for example, be a differential signal transmitted over two conductors. In other examples, LO2 may be a single ended signal transmitted over a single conductor. LO2 is transmitted over a long, "lossy" line 118 to frequency divider 119 that resides in close proximity to the circuitry of transmit chain 115. During transmission over long, "lossy" line 118 signal LO2 suffers parasitic power losses that attenuate its peak to peak amplitude and high frequency components.

Figure 5:
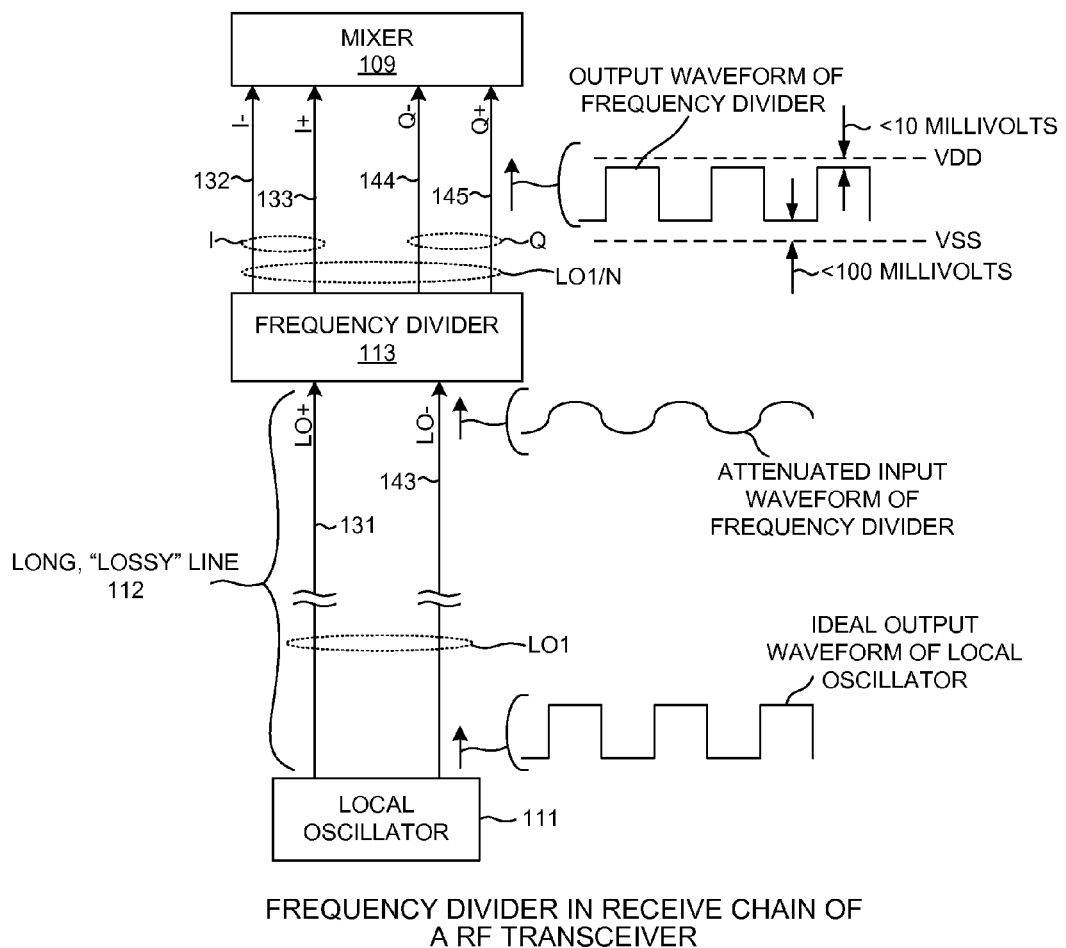
FIG. 5 is a diagram of the operation of frequency divider 113 within receive chain 108 of RF transceiver integrated circuit 102 of FIG. 4.

FIG. 5 is more detailed diagram of the operation of frequency divider 113 within receive chain 108 of RF transceiver integrated circuit 102 of FIG. 4. Frequency divider 113 is coupled to mixer 109 by conductors 132, 133, 144, and 145. Frequency divider 113 is coupled to local oscillator 111 by conductors 131 and 143. Frequency divider 113 receives differential input signal LO1 involving signal LO+ on conductor 131 and signal LO− on conductor 143. Frequency divider 113 generates a divided-down output signal LO1/N by frequency dividing input signal LO1 by integer, N. LO1/N includes two differential output signals, I and Q. Differential output signal I involves signal I+ on conductor 132 and signal I− on conductor 133. Differential output signal Q involves signal Q+ on conductor 144 and signal Q− on conductor 145. Together I+, I−, Q+, and Q− are four divided-down oscillatory signals in phase quadrature. As explained below, all four signals approximate a frequency divided version of the input waveform LO1, but each of the four signal representations are characterized by a difference of approximately ninety degrees of phase.

Mixer 109 includes mixer buffer stages that receive differential output signals, I and Q, over conductors 132, 133, 144, and 145. The mixer buffer stages include inverter circuitry. Inverter based mixer buffer stages are used for their power efficient operational characteristics. However, they require approximately rail to rail input waveforms to operate reliably. Thus, differential output signals, I and Q must approximate ideal rail to rail amplitude waveforms to reliably drive mixer 109. In operation, output signals I+, I−, Q+, and Q− oscillate between a maximum voltage within a few tens of millivolts of the circuit supply voltage, VDD, and a minimum voltage within a few tens of millivolts of circuit ground voltage, VSS. Mixer buffer stages of mixer 109 operate reliably when driven from output signals I+, I−, Q+, and Q− from frequency divider 113.

Local oscillator 111 is coupled to frequency divider 113 by long, "lossy" line 112. In the present example, local oscillator 111 generates differential signal LO1. Long, "lossy" line 112 includes conductor 131 involving signal LO+ and conductor 143 involving signal LO−. In other examples, local oscillator 111 may generate a single ended signal and line 112 may include only a single conductor involving the single ended input signal. In a wireless communication system such as a battery powered cellular telephone, local oscillator 111 supplies oscillatory signals to a variety of sub-circuits. Thus, it is not possible to construct local oscillator 111 in close physical proximity to each sub-circuit. As a result, local oscillator 111 is often not in close physical proximity to frequency divider 113 of receive chain 108. For example, long, "lossy" line 112 is one millimeter or more in length. Because of this length, an oscillatory signal communicated over line 112 falls prey to several power loss mechanisms. Capacitive coupling to the die substrate has a low-pass filter effect on high frequency oscillatory signals transmitted over line 112. Electro-magnetic radiation losses also attenuates the amplitude of a high frequency signal transmitted over line 112 and the charging/discharging of line 112 causes ½$cv^2f$ losses. Due to its length, line 112 acts like an antenna and high frequency signals transmitted over line 112 suffer radiation losses. As a result of these power losses, an oscillatory signal transmitted over line 112 suffers attenuation of peak to peak signal amplitude and attenuation of high frequency components. For example, a waveform of signal LO from local oscillator 111 measured in close physical proximity to local oscillator 111 may closely resemble an ideal square wave. However, the same signal measured in close proximity to the input of frequency divider 113 may be attenuated in amplitude and high frequency components. For purposes of illustration, the transitions of the square wave are heavily attenuated and appear as rounded corners at each transition. Although these power losses can be overcome by increasing the transmission power, this results in an undesirable increase in power consumption. Thus, frequency divider 113 should be able to divide the attenuated input signal reliably.

Figure 6:
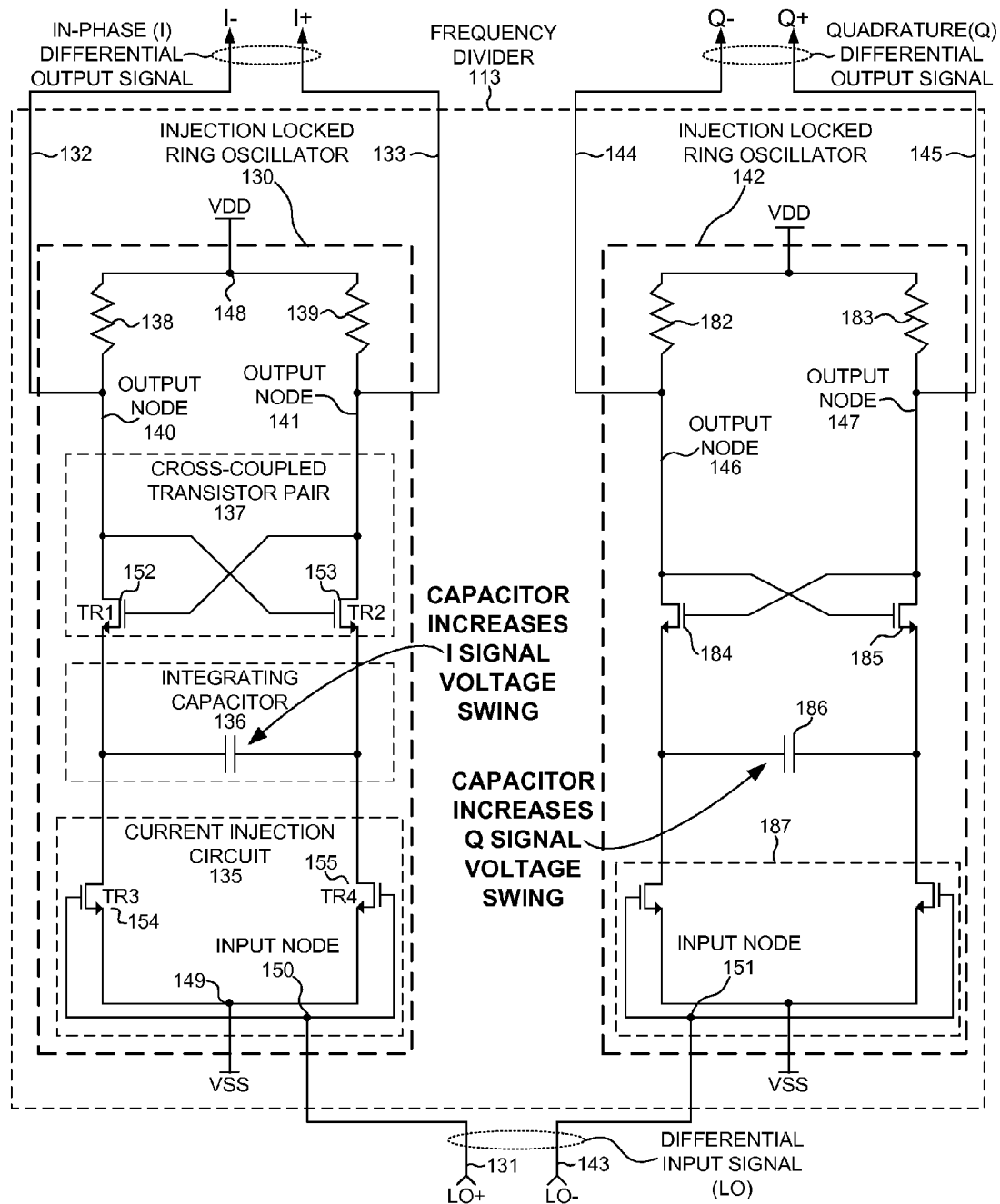
FIG. 6 is a more detailed diagram of frequency divider 113 of the receive chain 108 of the RF transceiver integrated circuit 102 of FIG. 4.

FIG. 6 is a more detailed diagram of frequency divider 113 of the receive chain 108 of the RF transceiver integrated circuit 102 of FIG. 4. Frequency divider 113 includes two injection-locked ring oscillators (ILRO) 130 and 142. Injection-locked ring oscillator 130 includes a pair of load resistors, 138 and 139, a cross-coupled transistor pair 137, an integrating capacitor 136, and a current injection circuit 135. In the present example, the resistance value of each of resistors 138 and 139 is 200 ohms In other examples, other resistance values may be employed. A first lead of the first resistor 138 and a first lead of the second resistor 139 are coupled to a voltage reference node 148. A circuit supply voltage, VDD, is supplied at voltage reference node 148. For example, VDD may be as little as 700 millivolts. A second lead of resistor 138 is coupled to oscillating node 140 and a second lead of resistor 139 is coupled to oscillating node 141. Output signal I− is present at oscillating node 140 and is communicated from frequency divider 113 on conductor 132. Output signal I+ is present on oscillating node 141 and is communicated from frequency divider 113 on conductor 133. The cross-coupled transistor pair 137 includes N-channel transistor 152 (TR1) and N-channel transistor 153 (TR2). The drain of TR1 is coupled to oscillating node 140 and the drain of TR2 is coupled to oscillating node 141. In addition, the gate of TR1 is coupled to the drain of TR2 and the gate of TR2 is coupled to the drain of TR1. The transconductance value of TR1 and TR2 multiplied by the load resistance value defines a gain of ILRO 130. The gain must be greater than one for division to occur. In the present example, a gain larger than two is employed for reliable division. Integrating capacitor 136 includes a first lead coupled to the source of TR1 and a second lead coupled to the source of TR2. In the present example, integrating capacitor 136 is a metal to metal capacitor having a capacitance value of tens to several hundred femtofarads. Current injection circuit 135 includes N-channel transistor 154 (TR3) and N-channel transistor 155 (TR4). The drain of TR3 is coupled to the first lead of integrating capacitor 136 and the drain of TR4 is coupled to the second lead of integrating capacitor 136. In this example, TR3 and TR4 are similar to TR1 and TR2 in size. The source of TR3 and the source of TR4 are coupled to a second voltage reference node 149. Second voltage reference node 149 supplies a second circuit supply voltage, VSS. For example, VSS may be circuit ground. In addition, the gate of TR3 and the gate of TR4 are coupled to input node 150 of injection-locked ring oscillator 130. Input node 150 is coupled to conductor 131.

Injection-locked ring oscillator (ILRO) 142 is analogous to injection-locked ring oscillator 130. ILRO 142 includes a pair of load resistors, 182 and 183, a cross-coupled transistor pair including N-channel transistors 184 and 185, an integrating capacitor 186, and a current injection circuit 187. Output signal Q− is present at oscillating node 146 and is communicated from frequency divider 113 on conductor 144. Output signal Q+ is present on oscillating node 147 and is communicated from frequency divider 113 on conductor 145. Input node 151 of injection-locked ring oscillator 142 is coupled to conductor 143. ILRO 130 and ILRO 142 are clocked on opposite phases of input signal LO due to the communication of the LO+ signal to input voltage node 150 of ILRO 130 and the communication of the LO− signal to input voltage node 151 of ILRO 142. In the present example, each LO+ and LO− signal has an oscillatory waveform and oscillates between approximately 100 millivolts and 1.3 volts.

FIGS. 7A-7D are more detailed diagrams of injection-locked ring oscillator 130 of frequency divider 113 in operation. Input signal LO+ is communicated on conductor 131 to input voltage node 150 of ILRO 130. In the present example, LO+ may be a square wave signal with a frequency of oscillation of a few hundred megahertz to a few gigahertz. FIGS. 7A-7D illustrate a full output cycle of operation of ILRO 130 from time T0 to time T4 in four stages, respectively. FIGS. 7A-7D are illustrative of voltage waveforms of LO+, I+, and I− from time T0 to time T4. Over the period of time, T0-T4, LO+ undergoes two full cycle periods. Over the same period of time, I− and I+ undergo one full cycle period. Thus, the operation of ILRO 131 results in a divide by two frequency division of LO+.

Figure 7A:
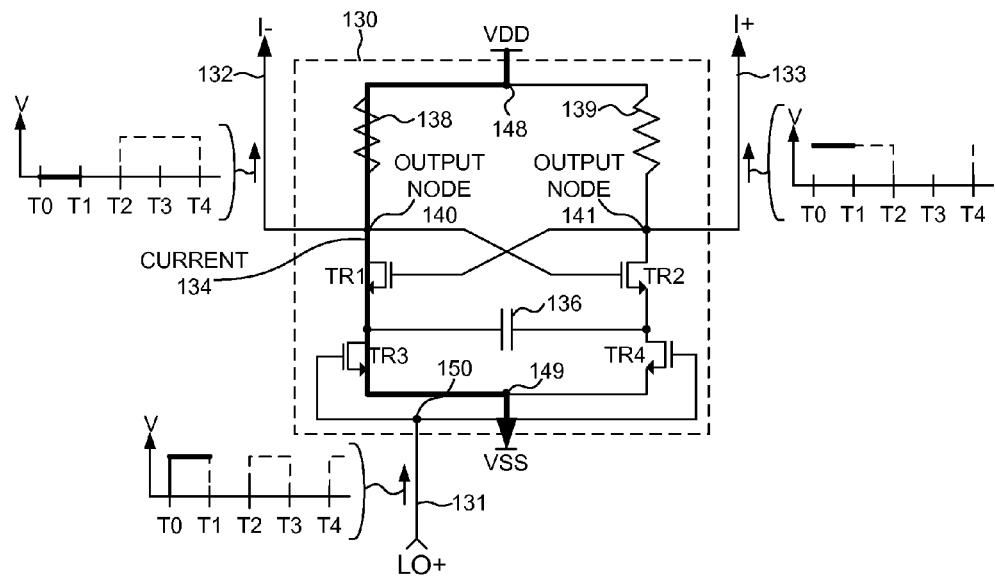
FIGS. 7A-7D are more detailed diagrams of injection-locked ring oscillator 130 of frequency divider 113 of FIG. 6 in operation.

FIG. 7A is illustrative of ILRO 130 in a "latch" state. The "latch" state is characterized by the period of time when input signal LO+ is in a digital high state. FIG. 7A illustrates the latch state during the period of time from T0 to T1 when LO+ is in a high state. Signal LO+ at input voltage node 150 is communicated to the gates of TR3 and TR4. Transistors TR3 and TR4 of ILRO 130 are driven in the non-linear region of transistor operation by LO+. Thus, they are conductive when LO+ is in a high state. At time T0, the drain of TR1 is at a low voltage state and the drain of TR2 is at a high voltage state. Because the high voltage state at the drain of TR2 is communicated to the gate of TR1, TR1 is substantially conductive. Since both TR1 and TR3 are conductive at T0, a current 134 flows from circuit supply voltage node 148, through load resistor 138, TR1, and TR3 to circuit ground node 149. Current 134 is approximately equal to the circuit supply voltage at node 148, VDD, divided by the resistor value of load resistor 138 because the resistance values of transistors TR1 and TR3 in a conductive state are significantly smaller than the resistance value of load resistor 138. Because the low voltage state at the drain of TR1 is communicated to the gate of TR2, TR2 is substantially not conductive. Because TR2 is substantially not conductive, there is substantially no current flow through TR2 and the voltage state at the drain of TR2 remains high. Throughout the "latch" state from T0 to T1, the voltage state at the drain of TR2 continues to be driven high and the voltage state at the drain of TR1 continues to be driven low. The term "latch" state refers to the notion that signals I− and I+, present at the drains of TR1 and TR2, respectively, continue to be driven to their initial state for the duration of the "latch" state. In the case illustrated in FIG. 7A, the "latch" state persists from time T0 to time T1.

Figure 7B:
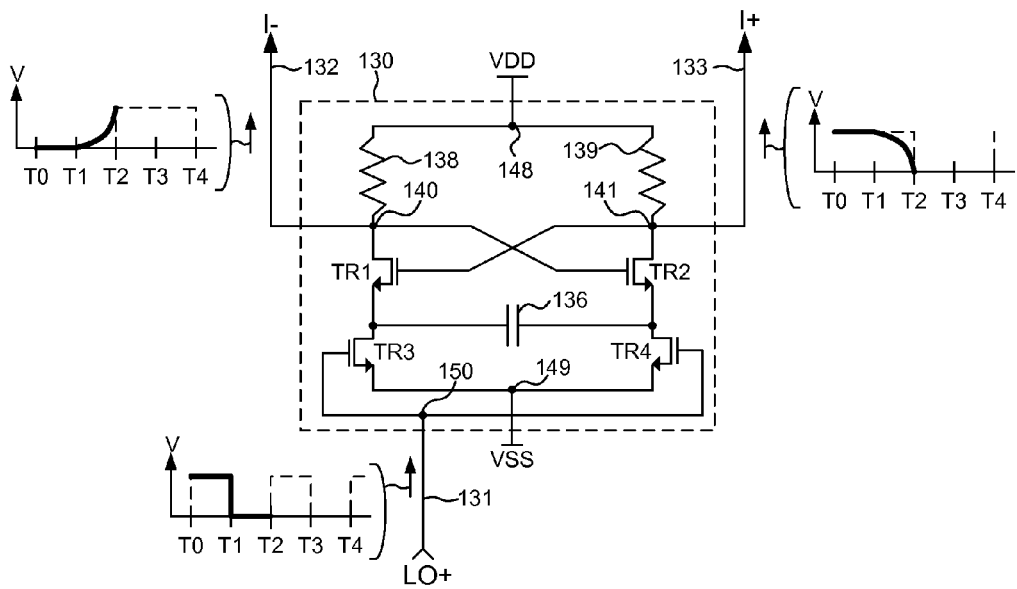

FIG. 7B is illustrative of ILRO 130 in a "toggle" state. The "toggle" state is characterized by the period of time when LO+ is in a digital low state. FIG. 7B illustrates the toggle state during the period of time from T1 to T2 when LO+ is low. When LO+ is in a low state, transistors TR3 and TR4 are non-conductive because TR3 and TR4 are driven in the non-linear region of transistor operation by LO+. The transition between conductive and non-conductive states of TR3 and TR4 is very short in time relative to the period of oscillation of LO+. Furthermore, the terms conductive state and non-conductive state should not imply a state of perfect conduction or perfect lack of conduction, but are determined by practical N-channel transistor implementations. At time T1, the drain of TR1 is at a low voltage state and the drain of TR2 is at a high voltage state. Because the high voltage state at the drain of TR2 is communicated to the gate of TR1, TR1 is substantially conductive. However, since TR1 is substantially conductive and TR3 is substantially non-conductive beginning at T1, current flows from circuit supply voltage node 148, through load resistor 138 into integrating capacitor 136. As time progresses from time T1 to T2, voltage builds at the source of TR1 and since TR1 and TR2 operate in the linear region of transistor operation, voltage also builds at the drain of TR1. The voltage signal building at the drain of TR1 is communicated to the gate of TR2. In response, TR2 begins to conduct. As a result current begins to flow from circuit supply voltage node 148, through load resistor 139 and into integrating capacitor 136. As this current begins to flow, the voltage at the drain of TR2 begins to drop. Since the voltage signal at the drain of TR2 is communicated to the gate of TR1, TR1 begins to transition from being substantially conductive to being substantially non-conductive. Thus, signal I− at the drain of TR1 is driven from a low voltage state to a high voltage state by the combination of two mechanisms. The first mechanism is by increasing voltage at the source of TR1 as the current passing through TR1 charges integrating capacitor 136. The second mechanism is the cross-coupling of the drain of TR1 with the gate of TR2 and the drain of TR2 to the gate of TR1. This cross-coupling accelerates the shut-off of TR1 by communicating a low voltage signal to the gate of TR1 in response to rising voltage at the drain of TR1. Thus, integrating capacitor 136 increases the voltage swing of signal I− at output node 140 by enabling these two mechanisms. Throughout the "toggle" state from T1 to T2, the voltage state at the drain of TR1 is driven low and the voltage state at the drain of TR2 is driven high. The term "toggle" state refers to the notion that signals I− and I+, present at the drains of TR1 and TR2, respectively, are driven to states opposite their initial state for the duration of the "toggle" state. In the case illustrated in FIG. 7A, the "toggle" state persists from time T1 to time T2.

Figure 7C:
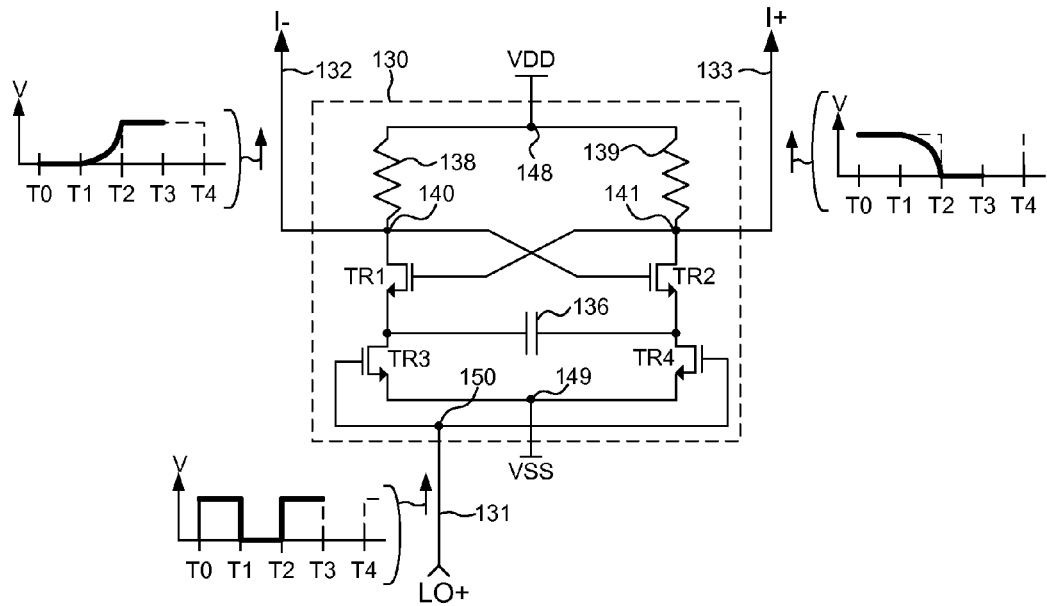

FIG. 7C is illustrative of ILRO 130 in a "latch" state as LO+ is once again in a digital high state. FIG. 7C illustrates the latch state during the period of time from T2 to T3. Transistors TR3 and TR4 quickly switch to a conductive state in response to the transition of LO+ to a high state. At time T2, the drain of TR1 is at a high voltage state and the drain of TR2 is at a low voltage state. Because the low voltage state at the drain of TR2 is communicated to the gate of TR1, TR1 is substantially non-conductive. Because TR1 is substantially not conductive, there is substantially no current flow through TR1 or TR3 and the voltage state at the drain of TR1 remains high. Because the high voltage state at the drain of TR1 is communicated to the gate of TR2, TR2 is substantially conductive. Since both TR2 and TR4 are conductive at T2, current flows from circuit supply voltage node 148, through load resistor 139 to circuit ground node 149. This current flow is approximately equal to the circuit supply voltage at node 148, VDD divided by the resistor value of load resistor 139 because the resistance values of transistors TR2 and TR4 in a conductive state are significantly smaller than the resistance value of load resistor 139. Throughout the "latch" state from T2 to T3, the voltage state at the drain of TR1 continues to be driven high and the voltage state at the drain of TR2 continues to be driven low. Thus, signals I− and I+ present at the drains of TR1 and TR2, respectively, continue to be driven to their initial state for the duration of the "latch" state from time T2 to time T3.

Figure 7D:
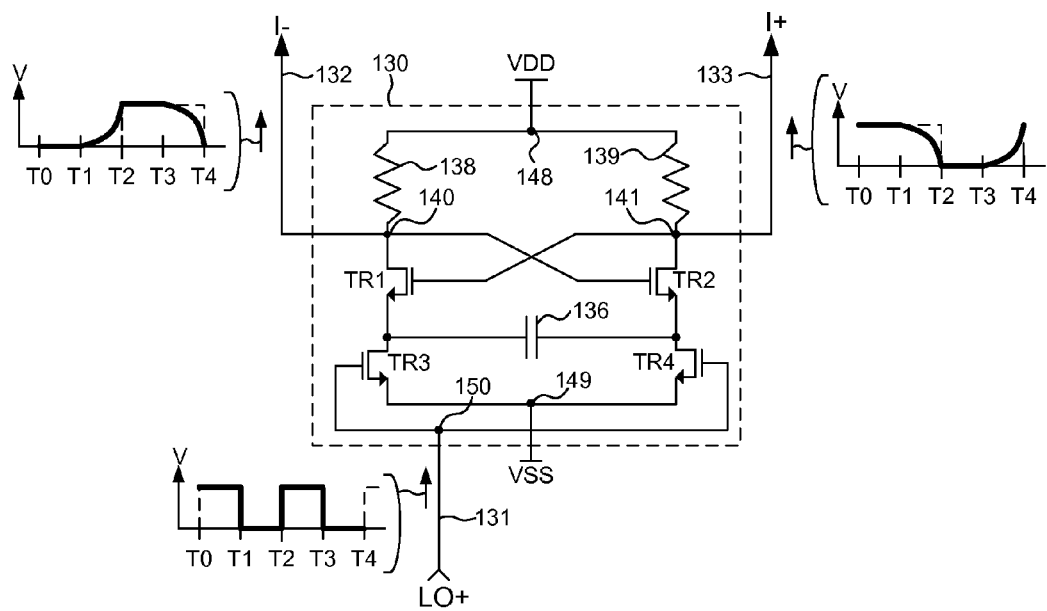

FIG. 7D is illustrative of ILRO 130 again in a "toggle" state. FIG. 7D illustrates the toggle state during the period of time from T3 to T4 when LO+ is low. Transistors TR3 and TR4 quickly transition to a non-conductive state in response to the transition of LO+ to a low state. At time T3, the drain of TR1 is at a high voltage state and the drain of TR2 is at a low voltage state. Because the high voltage state at the drain of TR1 is communicated to the gate of TR2, TR2 is substantially conductive. However, since TR2 is substantially conductive and TR4 is substantially non-conductive at T3, current flows from circuit supply voltage node 148, through load resistor 139 into integrating capacitor 136. As time progresses from time T3 to T4, voltage builds at the source of TR2 and since TR1 and TR2 operate in the linear region of transistor operation, voltage also builds at the drain of TR2. The voltage signal building at the drain of TR2 is communicated to the gate of TR1. In response, TR1 begins to conduct. As a result current begins to flow from circuit supply voltage node 148, through load resistor 138 and into integrating capacitor 136. As this current begins to flow, the voltage at the drain of TR1 begins to drop. Since the voltage signal at the drain of TR1 is communicated to the gate of TR2, TR2 begins to transition from being substantially conductive to being substantially non-conductive, restricting current flow through TR2 and further building up voltage at the drain of TR2. Thus, the voltage signal at the drain of TR2 is driven from a low voltage state to a high voltage state by the combination of two mechanisms. The first mechanism is increasing voltage at the source of TR2 as the current passing through TR2 charges integrating capacitor 136. The second mechanism is the cross-coupling of the drain of TR2 with the gate of TR1 and the drain of TR1 to the gate of TR2. This cross-coupling accelerates the shut-off of TR2 by communicating a low voltage signal to the gate of TR2 in response to rising voltage at the drain of TR2. Thus, integrating capacitor 136 increases the voltage swing of signal I+ at output node 141 by enabling these two mechanisms. Throughout the "toggle" state from T3 to T4, the voltage state at the drain of TR2 is driven high and the voltage state at the drain of TR1 is driven low. The term "toggle" state refers to the notion that signals I− and I+, present at the drains of TR1 and TR2, respectively, are driven to states opposite their initial state for the duration of the "toggle" state. In the case illustrated in FIG. 7D, the "toggle" state persists from time T3 to time T4.

Figure 8:
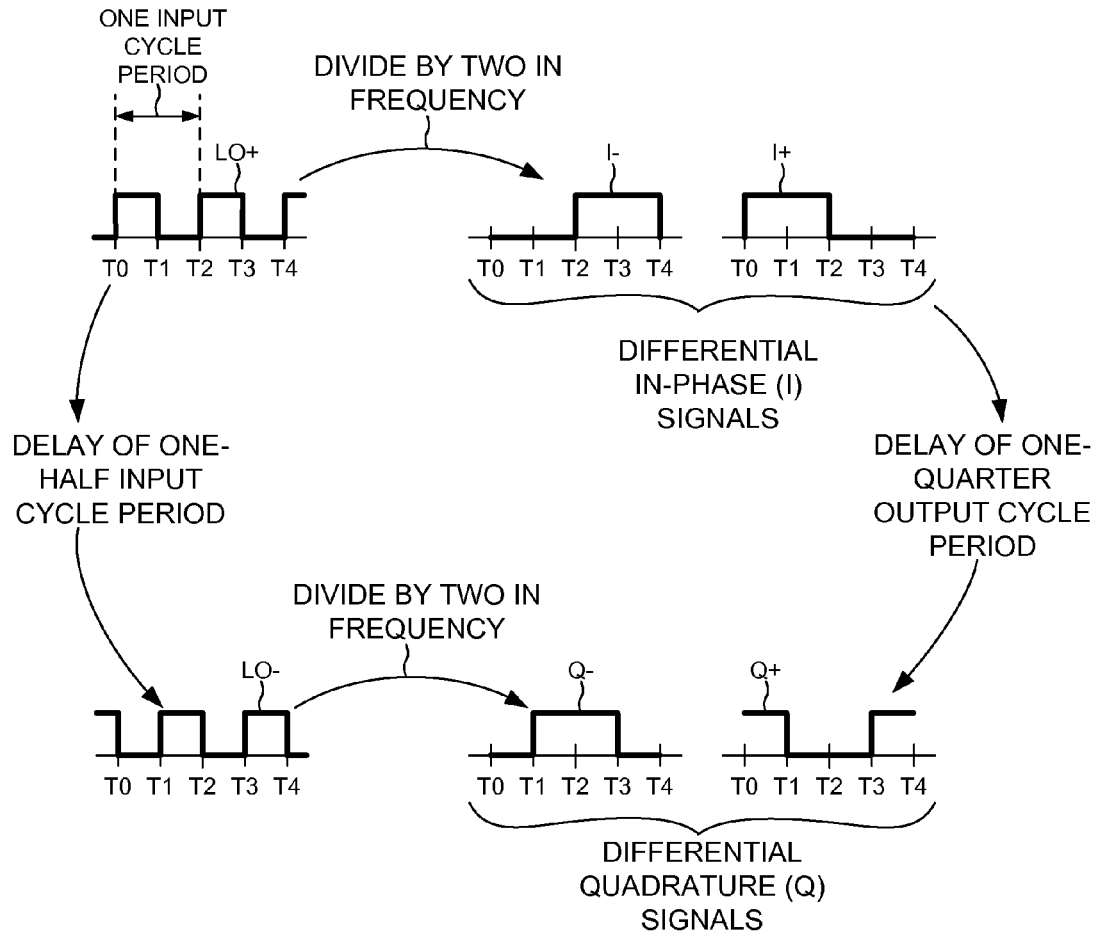
FIG. 8 is illustrative of the input and output waveforms of frequency divider 113 in operation.

FIG. 8 is illustrative of the input and output waveforms of frequency divider 113 in operation. As discussed in detail in FIGS. 7A-7D, first ILRO 130 receives LO+, performs a divide by two operation in frequency, and outputs divided-down oscillatory signals I+ and I− in anti-phase. In an analogous manner, ILRO 142 receives oscillatory input signal LO−, performs a divide by two operation in frequency, and outputs divided-down oscillatory output signals Q+ and Q− in anti-phase. The oscillatory frequency of input signal LO is characterized by the period of time that elapses for input signal LO to trace a complete cycle. This period of time may be referred to as the input cycle period. The oscillatory frequency of each of the divided down oscillatory signals is characterized by the period of time that elapses for each of the signals to trace a complete cycle. This period of time may be referred to as the output cycle period. Because ILRO 130 and 142 divide by two in frequency the output cycle period is twice the input cycle period. Since LO+ and LO− are opposite phases of input signal LO, LO− can be characterized as lagging LO+ in time by one half of the input cycle period, or equivalently, one quarter of the output cycle period. This delay propagates directly through ILRO 142 such that signals Q+ and Q− lag signals I+ and I−, respectively by one quarter of the output cycle period. Alternatively this lag can be expressed as ninety degrees of phase lag. Thus, the output of frequency divider 113 is a set of four signals (I+, I−, Q+, Q−) in phase quadrature, each oscillating at half the frequency of input signal LO.

Figure 9:
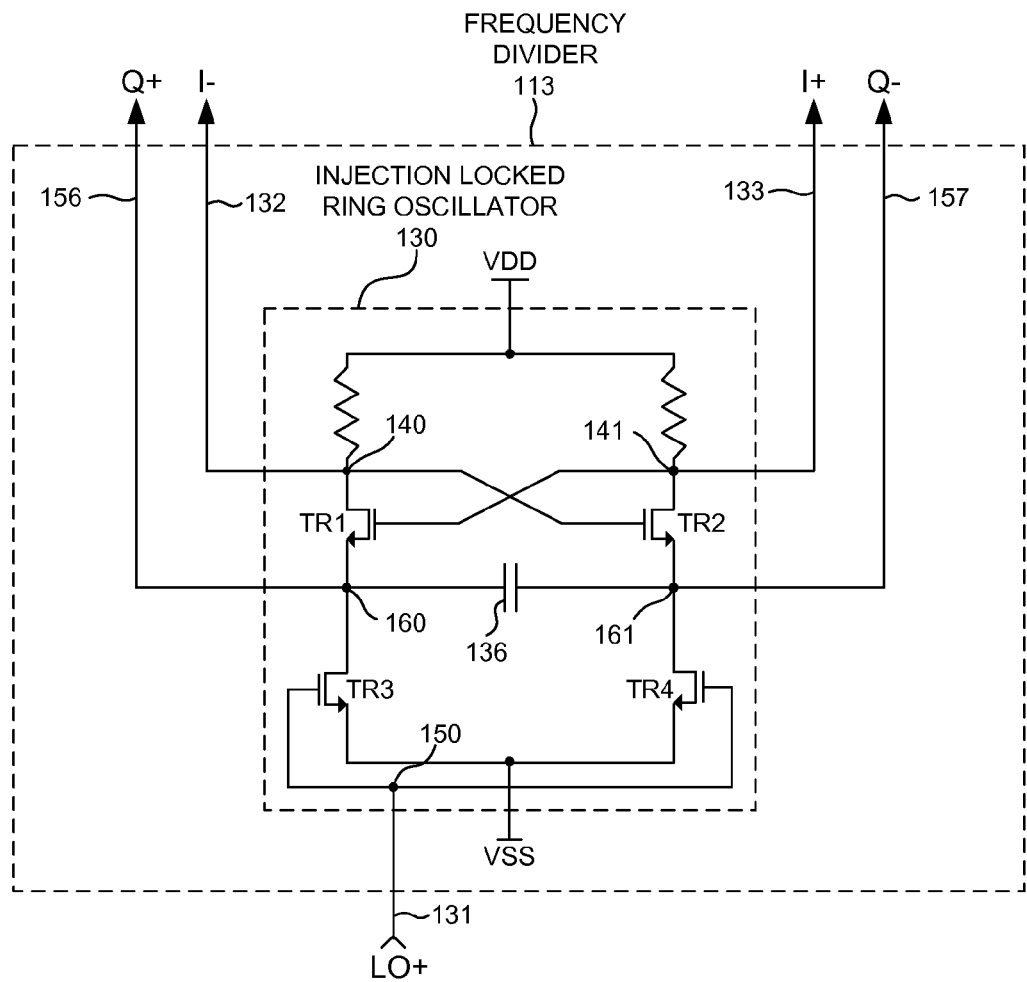
FIG. 9 is illustrative of a second embodiment of frequency divider 113.

FIG. 9 is illustrative of a second embodiment of frequency divider 113. Frequency divider 113 includes ILRO 130 only. As depicted in FIG. 9, ILRO 130 is as described in FIG. 6. However, in the present example, ILRO 130 includes output node 160 coupled to the source of TR1 and output node 161 coupled to the source TR2. Output signal Q+ is present on output node 160 and is communicated from frequency divider 113 on conductor 156. Output signal Q− is present on output node 161 and is communicated from frequency divider 113 on conductor 157. ILRO 130 receives oscillatory input signal LO+ over conductor 131, performs a divide by two operation in frequency, and outputs divided down oscillatory signals I+, I−, Q+, and Q− on conductors 133, 132, 156, and 157 respectively. Signal Q+ present at output node 160 lags signal I− present at oscillating node 140 by approximately ninety degrees. Similarly, signal Q− present at oscillating node 161 lags signal I+ present at oscillating node 141 by approximately ninety degrees. Thus, in combination, the signals present at oscillating nodes 140, 141, 160, and 161 are in phase quadrature. Thus, a single ILRO driven by a single-ended oscillatory signal can perform divide by two frequency division and output four divided down oscillatory signals in phase quadrature. The second embodiment does not equal the phase noise performance of the first embodiment. But, power is conserved by using only one ILRO rather than two to perform divide by two frequency division with phase quadrature output. In addition, only one conductor is required to communicate the oscillatory input signal from local oscillator 111 to frequency divider 113, saving space on an integrated circuit die. Thus, in applications where performance can be traded for lower cost and power consumption, the second embodiment of frequency divider 113 may be preferable over the first embodiment.

Figure 10:
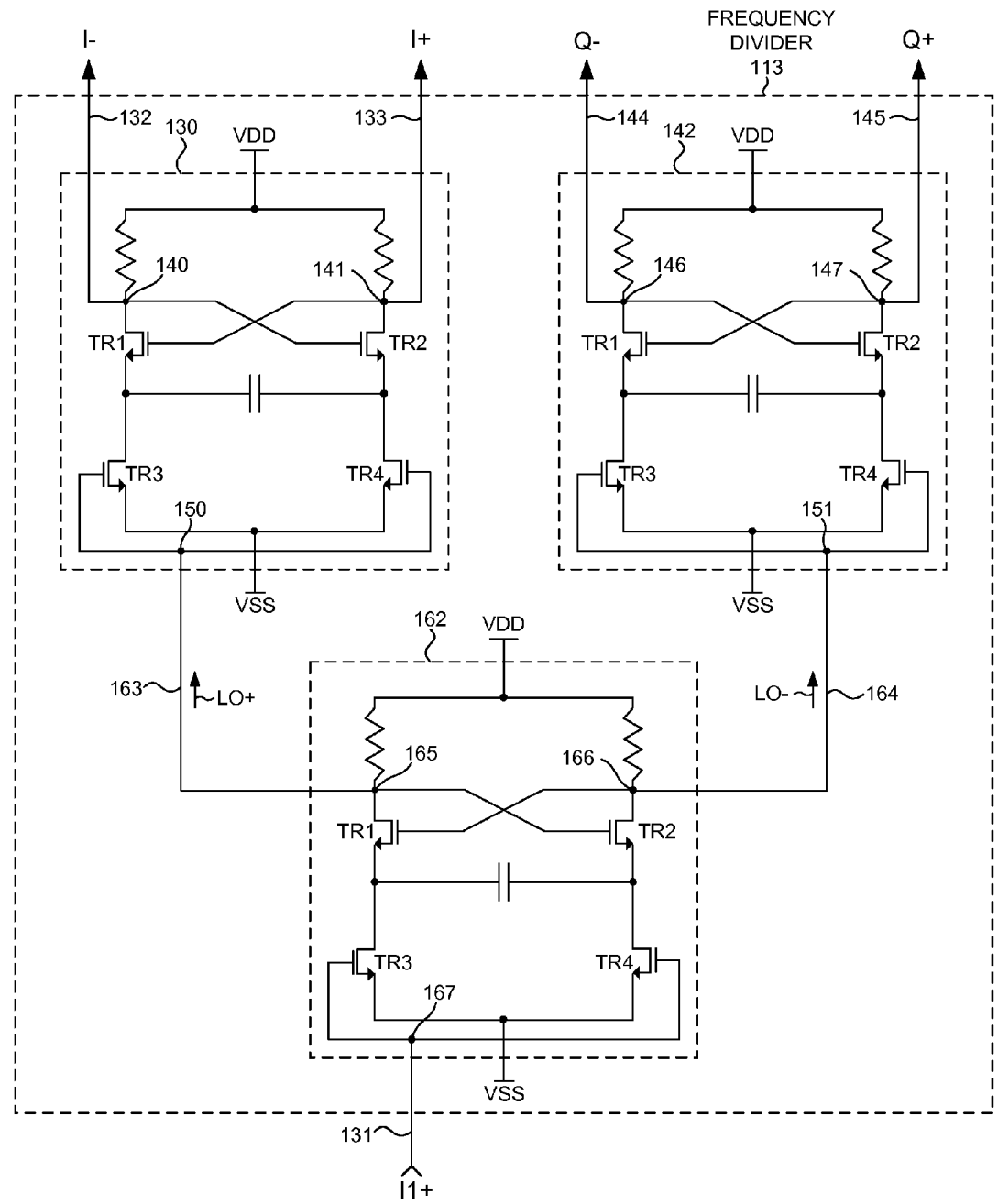
FIG. 10 is illustrative of a divide by four operation of frequency divider 113 in a third embodiment.

FIG. 10 is illustrative of a divide by four operation of frequency divider 113 in a third embodiment. In the present example, frequency divider 113 includes ILRO 130, ILRO 142, and ILRO 162. As depicted in FIG. 10, ILRO 130 and ILRO 142 are as described in FIG. 6 and ILRO 162 is analogous to ILRO 130. Output signal I− is present at oscillating node 140 of ILRO 130 and is communicated from frequency divider 113 on conductor 132. Output signal I+ is present on oscillating node 141 of ILRO 130 and is communicated from frequency divider 113 on conductor 133. Output signal Q− is present at oscillating node 146 of ILRO 142 and is communicated from frequency divider 113 on conductor 144. Output signal Q+ is present on oscillating node 147 of ILRO 142 and is communicated from frequency divider 113 on conductor 145. Input signal I1+ is present on input node 167 of ILRO 162. Input node 167 is coupled to conductor 131, and input signal I1+ is received by frequency divider 113 on conductor 131. Oscillating node 165 of ILRO 162 is coupled to input node 150 of ILRO 130 by conductor 163. Oscillating node 166 of ILRO 162 is coupled to input node 151 of ILRO 142 by conductor 164.

ILRO 162 receives oscillatory input signal I1+ over conductor 131 and performs a divide by two operation in frequency as discussed above with respect to ILRO 130. ILRO 162 outputs differential output signal LO as divided down oscillatory signal LO+ present on output node 165 and divided down oscillatory signal LO− present on output node 166. ILRO 130 and ILRO 142 are clocked on opposite phases of input signal LO due to the communication of the LO+ signal from node 165 to input voltage node 150 of ILRO 130 on conductor 163 the communication of the LO− signal from node 166 to input voltage node 151 of ILRO 142 on conductor 164. ILRO 130 receives oscillatory input signal LO+, performs a divide by two operation in frequency, and outputs divided down oscillatory signals I+, I−. Similarly, ILRO 142 receives oscillatory input signal LO−, performs a divide by two operation in frequency, and outputs divided down oscillatory signals Q+, Q−. Signals I+, I−, Q+, and Q− are in phase quadrature. Since ILRO 162 performs a first divide by two frequency division and ILROs 130 and 142 perform a subsequent divide by two frequency division, frequency divider 113, as depicted in FIG. 10, divides by four in frequency. In an analogous manner, a divide by N operation can be performed where N is a power of 2. For example, Y ILROs can be configured in series where the first ILRO of the series receives input signal I1+ and the last of the series outputs a divided down differential signal to drive ILRO 130 and 142. Each of the Y ILROs performs a divide by two frequency division. ILRO 130 and ILRO 142 perform the last divide by two operation and produce four output signals in phase quadrature. Alternatively, the second embodiment of frequency divider 113 could be employed as the last ILRO of the series and all four output signals in phase quadrature could be output by a single ILRO.

Figure 11:
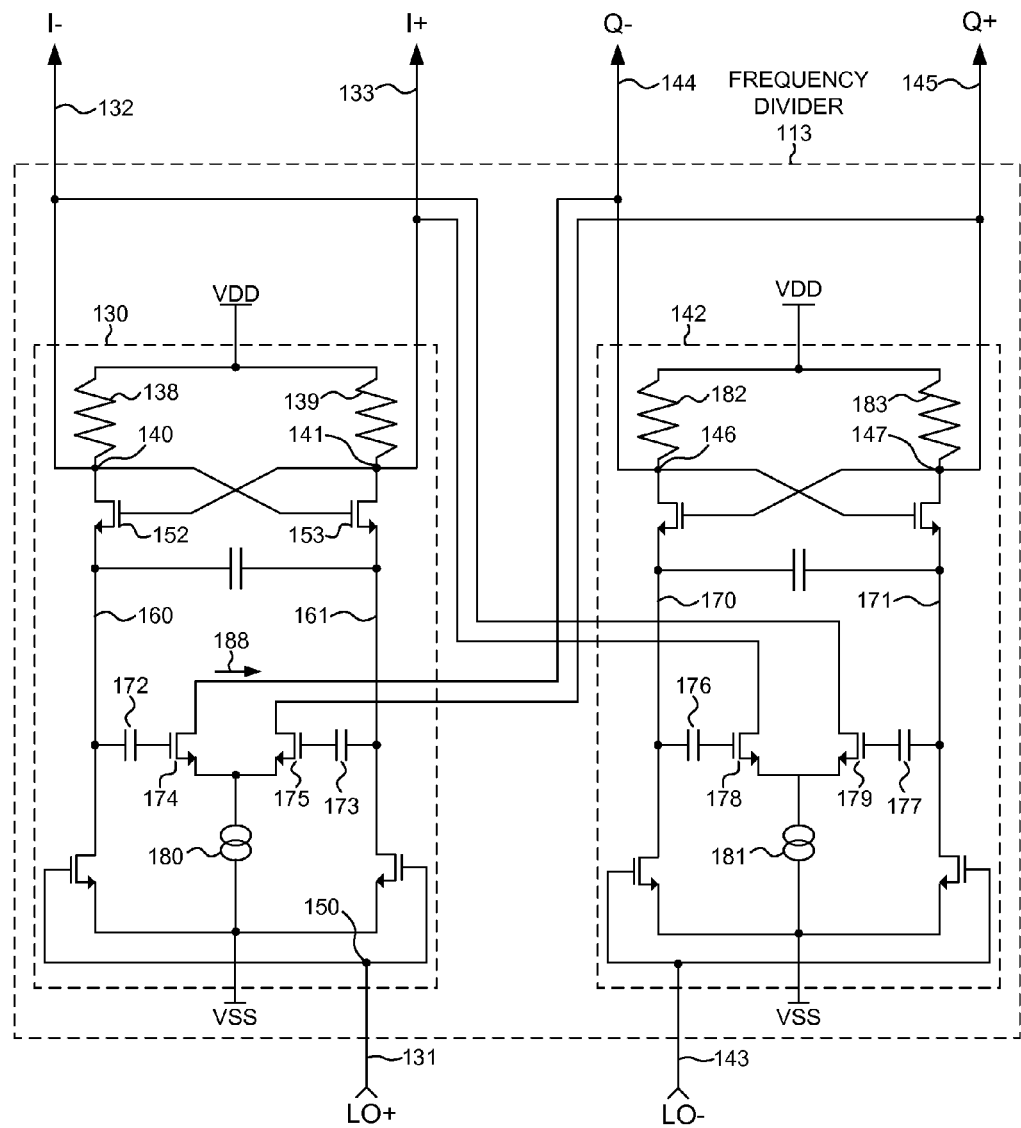
FIG. 11 is illustrative of frequency divider 113 in a fourth embodiment.

FIG. 11 is illustrative of frequency divider 113 in a fourth embodiment. In the present example, frequency divider 113 includes ILRO 130 and ILRO 142. As depicted in FIG. 11, ILRO 130 and ILRO 142 are as described in FIG. 6, however, in the present example additional elements are included. ILRO 130 includes transistors 174 and 175. The source of transistor 174 and the source of transistor 175 are coupled to a first lead of current source 180. A second lead of current source 180 is coupled to circuit supply voltage source, VSS. The gate of transistor 174 is coupled to oscillating node 160 of ILRO 130 via Alternating Current (AC) coupling capacitor 172. AC coupling capacitor 172 is sized to block Direct Current (DC) offset voltage signals and pass high frequency (Alternating Current) AC voltage signals. Similarly, AC coupling capacitor 173 couples the gate of transistor 175 to oscillating node 161 of ILRO 130. The drain of transistor 174 is coupled to oscillating node 146 of ILRO 142. As coupled together, current source 180, transistor 174, and resistor 182 operate as an inverting amplifier of a voltage signal present at the gate of transistor 174. The drain of transistor 175 is coupled to oscillating node 147 of ILRO 142. As coupled together, current source 180, transistor 175, and resistor 183 operate as an inverting amplifier of a voltage signal present at the gate of transistor 175. ILRO 142 includes transistors 178 and 179. The source of transistor 178 and the source of transistor 179 are coupled to a first lead of current source 181. A second lead of current source 181 is coupled to circuit supply voltage source, VSS. The gate of transistor 178 is coupled to oscillating node 170 of ILRO 142 via Alternating Current (AC) coupling capacitor 176. AC coupling capacitor 176 is sized to block Direct Current (DC) offset voltage signals and pass high frequency (Alternating Current) AC voltage signals. Similarly, AC coupling capacitor 177 couples the gate of transistor 179 to oscillating node 171 of ILRO 142. The drain of transistor 179 is coupled to oscillating node 140 of ILRO 130. As coupled together, current source 181, transistor 179, and resistor 138 operate as an inverting amplifier of a voltage signal present at the gate of transistor 179. The drain of transistor 178 is coupled to oscillating node 141 of ILRO 130. As coupled together, current source 181, transistor 178, and resistor 139 operate as an inverting amplifier of a voltage signal present at the gate of transistor 178.

As noted with respect to the second embodiment, signal Q+ is present on oscillating node 160 of ILRO 130. This signal is passed by AC coupling capacitor 172 and inverted and amplified by the action of current source 180, transistor 174, and resistor 182 to generate inverted voltage signal 188. Signal 188 combines with signal Q− present on oscillating node 146 of ILRO 142. By combining these signals at oscillating node 146 there are now two transistors switching the state at oscillating node 146. This increases the rate of transition of the voltage signal at oscillating node 146. Furthermore, the voltage state at oscillating node 146 is being driven by both in-phase signal LO+ via ILRO 130 and anti-phase signal LO− via ILRO 142. Similarly, signal Q− is present on oscillating node 161 of ILRO 130. This signal is passed by AC coupling capacitor 173 and inverted and amplified by the action of current source 180, transistor 175, and resistor 183 to match with signal Q+ present on oscillating node 147 of ILRO 142. In an analogous manner, oscillating nodes 140 and 141 of ILRO 130 are cross-coupled to ILRO 142. By cross-coupling ILRO 130 and 142 at each oscillating node, phase noise is reduced, the deleterious effects of device mismatches on phase quadrature accuracy are reduced, and larger capacitive loads can be driven by frequency divider 113 for a given supply current.

Figure 12:
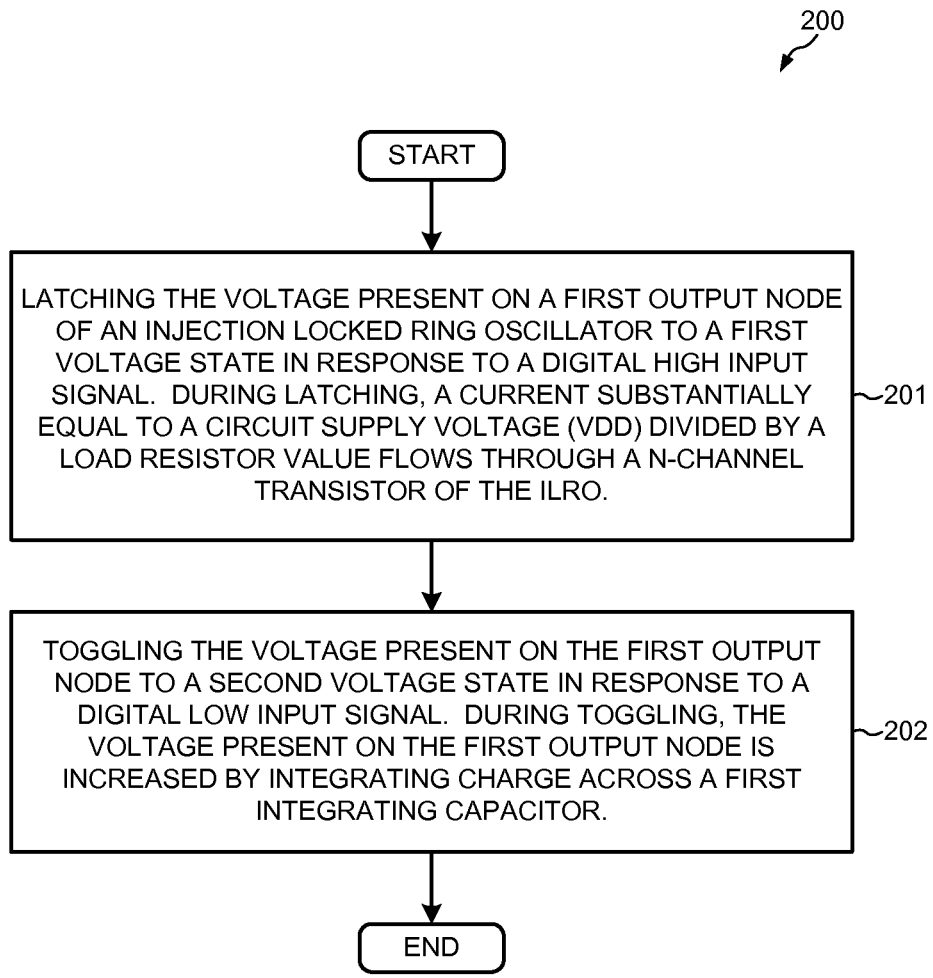
FIG. 12 is a flowchart of a method in accordance with one aspect.

FIG. 12 is a flowchart of a method 200 in accordance with one novel aspect. An Injection-locked Ring Oscillator (ILRO) 130 latches (step 201) a voltage present on a first node of ILRO 130 in response to a digital high input signal value. During the latch state, a current substantially equal to circuit supply voltage, VDD, divided by the resistance value of a load resistor coupled to the first node flows through an N-channel transistor coupled to the first node. In one example, the current 134 is shown in FIG. 7A. In another example, the voltage present on the first node is within one hundred millivolts of circuit ground, VSS.

Next (step 202), ILRO 130 toggles the voltage state present on the first node to a second voltage state in response to a digital low input signal value. During the toggle state, the voltage present on the first node is increased by integrating charge across an integrating capacitor. In one example, step 202 is shown in FIG. 7B. In another example, the second voltage state is within fifty millivolts of circuit supply voltage, VDD.

In one or more exemplary aspects, the functions described may be implemented in hardware, software, firmware, or any combination thereof. If implemented in software, the functions may be stored on as one or more instructions or code on a computer-readable medium. The steps of a method or algorithm disclosed herein may be embodied in a processor-executable software module executed which may reside on a computer-readable medium. Computer-readable media includes both computer storage media and communication media including medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

Figure 1:
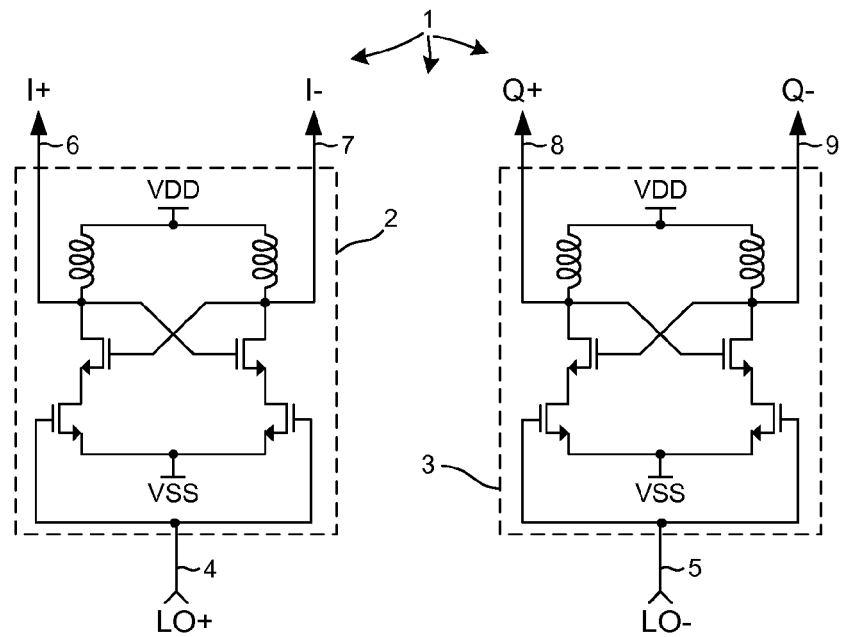
FIG. 1 (Prior Art) is a diagram of a frequency divider including two conventional Injection-locked Frequency Dividers (ILFD).
Figure 2:
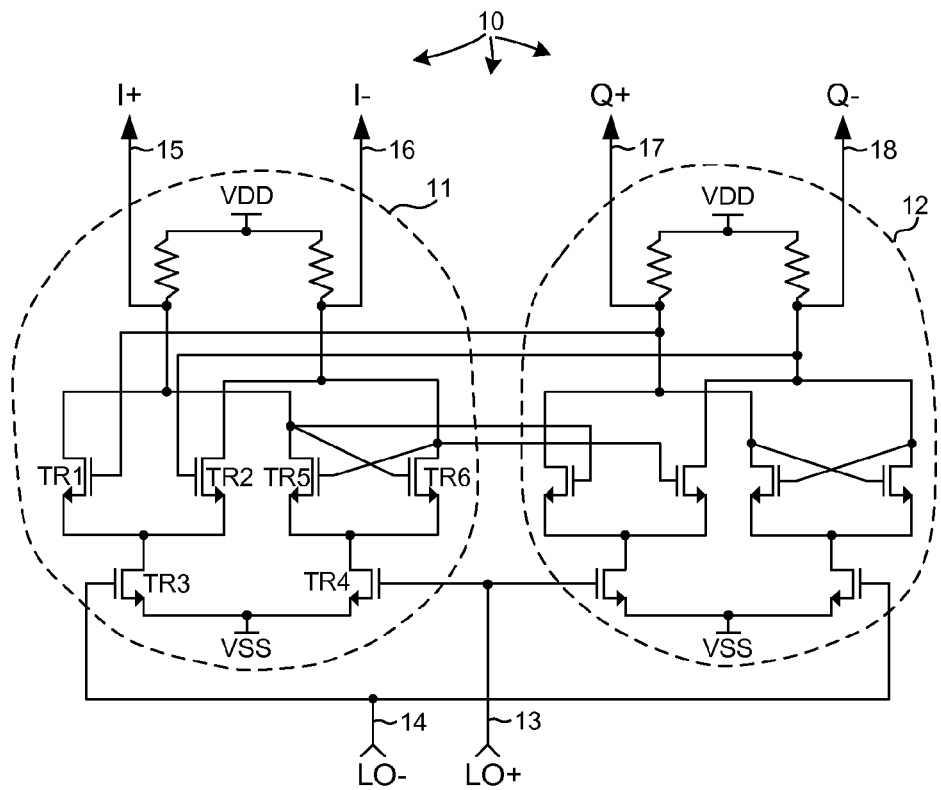
FIG. 2 (Prior Art) is a diagram of a frequency divider including two cross-coupled Common Mode Logic (CML) circuits.

In one illustrative example, a set of processor-executable instructions 191 is stored in a memory (a processor-readable medium) 192 in digital baseband integrated circuit 103 of FIG. 2. Processor 190 accesses memory 192 across a bus and executes the instructions 191, thereby causing integrated circuit 103 to configure and control and monitor frequency divider 113 in receive chain 108 of the RF transceiver integrated circuit 102.

Although certain specific embodiments are described above for instructional purposes, the teachings of this patent document have general applicability and are not limited to the specific embodiments described above. For example, a divide-by-two frequency divider has been described in this application as an injection-locked ring oscillator, although the frequency divider could be another injection-locked oscillator. Accordingly, various modifications, adaptations, and combinations of the various features of the described specific embodiments can be practiced without departing from the scope of the claims that are set forth below.

What is claimed is:

1. A frequency divider comprising:
a first Injection-locked Ring Oscillator (ILRO) comprising:
a first cross-coupled transistor pair including a first N-channel transistor and a second N-channel transistor, wherein a drain of the first N-channel transistor is a first output node, wherein a drain of the second N-channel transistor is a second output node, wherein a gate of the first N-channel transistor is coupled to the second output node, and wherein a gate of the second N-channel transistor is coupled to the first output node;
a first capacitor having a first lead coupled to a source of the first N-channel transistor and a second lead coupled to a source of the second N-channel transistor and configured to increase a first output signal voltage swing at the first and second output nodes;
a first current injection circuit comprising:
a third N-channel transistor having a source, a drain, and a gate, wherein the drain of the third N-channel transistor is coupled to the source of the first N-channel transistor, wherein the gate of the third N-channel transistor is coupled to the first input node of the first current injection circuit; and
a fourth N-channel transistor having a source, a drain, and a gate, wherein the drain of the fourth N-channel transistor is coupled to the source of the second N-channel transistor, and wherein the gate of the fourth N-channel transistor is coupled to the first input node of the first current injection circuit;
a first load resistor having a first lead and a second lead, wherein the first lead of the first load resistor is coupled to the first output node; and
a second load resistor having a first lead and a second lead, wherein the first lead of the second load resistor is coupled to the second output node, and wherein the second lead of the first load resistor and the second lead of the second load resistor are coupled to a supply voltage node,
wherein the first ILRO is configured to drive a first output signal at the first output node from a first voltage state to a second voltage state based on only one input signal being applied to the first ILRO, wherein the one input signal is applied to the first input node.

2. The frequency divider of claim 1, wherein the one input signal oscillates at a first frequency and the first output signal oscillates at a second frequency, and wherein the first the frequency is twice the second frequency.

3. The frequency divider of claim 1, further comprising:
a second Injection-locked Ring Oscillator (ILRO) comprising:
a second cross-coupled transistor pair including a fifth N-channel transistor and a sixth N-channel transistor, wherein a drain of the fifth N-channel transistor is a third output node, wherein a drain of the sixth N-channel transistor is a fourth output node, wherein a gate of the fifth N-channel transistor is coupled to the fourth output node, and wherein a gate of the sixth N-channel transistor is coupled to the third output node;
a second capacitor having a first lead coupled to the source of the fifth N-channel transistor and a second lead coupled to the source of the sixth N-channel transistor and configured to increase a second output signal voltage swing at the third and fourth output nodes; and a second current injection circuit having a first lead coupled to the source of the fifth N-channel transistor, a second lead coupled to the source of the sixth N-channel transistor, and a second input node.

4. The frequency divider of claim 3, wherein a differential input signal is present between the first input node of the first current injection circuit and the second input node of the second current injection circuit, wherein an in-phase (I) differential output signal is present between the first and second output nodes of the first ILRO, and wherein a quadrature (Q) differential output signal is present between the third and fourth output nodes of the second ILRO.

5. The frequency divider of claim 3, wherein the first ILRO further comprises:

a fifth N-channel transistor having a source, a drain, and a gate, wherein the drain of the fifth N-channel transistor is coupled to the third output node of the second ILRO, and wherein the gate of the fifth N-channel transistor is coupled to the source of the first N-channel transistor via a first Alternating Current (AC) coupling capacitor;

a sixth N-channel transistor having a source, a drain, and a gate, wherein the drain of the sixth N-channel transistor is coupled to the fourth output node of the second ILRO, wherein the gate of the sixth N-channel transistor is coupled to the source of the second N-channel transistor via a second Alternating Current (AC) coupling capacitor, and wherein the source of the fifth N-channel transistor and the source of the sixth N-channel transistor are coupled to a current source.

6. The frequency divider of claim 1, wherein an in-phase (I) differential output signal is present between the first and second output nodes, and wherein a quadrature (Q) differential output signal is present between the source of the first N-channel transistor and the source of the second N-channel transistor.

7. The frequency divider of claim 1, further comprising:

a second Injection-locked Ring Oscillator (ILRO) having a second input node, a third output node, and a fourth output node; and a third Injection-locked Ring Oscillator (ILRO) having a third input node, a fifth output node, and a sixth output node, wherein the fifth output node of the third ILRO is coupled to the first input node of the first ILRO, and wherein the sixth output node of the third ILRO is coupled to the second input node of the second ILRO.

8. The frequency divider of claim 7, wherein a third input signal applied at the third input node oscillates at a first frequency, wherein an in-phase (I) differential output signal of a second frequency is present between the first and second output nodes of the first ILRO, wherein a quadrature (Q) differential output signal is present between the third and fourth output nodes of the second ILRO, and wherein the first frequency is four times the second frequency.

9. The frequency divider of claim 1, wherein the source of the third N-channel transistor and the source of the fourth N-channel transistor of the current injection circuit are coupled to a ground node.

10. The frequency divider of claim 1, wherein a gain value of the first ILRO is greater than two.

11. A frequency divider comprising:

a first Injection-locked Ring Oscillator (ILRO) having a first input lead that receives a first oscillatory signal of a first frequency, a first output lead and a second output lead that output an in-phase (I) differential output signal of a second frequency, wherein the first frequency is twice the second frequency, and wherein the ILRO comprises:

a cross-coupled transistor pair including a first N-channel transistor and a second N-channel transistor, wherein a drain of the first N-channel transistor is coupled to the first output lead, wherein a drain of the second N-channel transistor is coupled to the second output lead;

a capacitor having a first lead coupled to a source of the first N-channel transistor and a second lead coupled to a source of the second N-channel and configured to increase a voltage swing of the in-phase (I) differential output signal;

a current injection circuit having a first lead coupled to the source of the first N-channel transistor, a second lead coupled to the source of the second N-channel transistor, and a third lead coupled to the first input lead of the first ILRO;

a first load resistor having a first lead and a second lead, wherein the first lead of the first load resistor is coupled to the first output lead; and a second load resistor having a first lead and a second lead, wherein the first lead of the second load resistor is coupled to the second output lead, and wherein the second lead of the first load resistor and the second lead of the second load resistor are coupled to a supply voltage node, wherein the first ILRO is configured to drive a first output signal at the first output lead from a first voltage state to a second voltage state based on only one input signal being applied to the first ILRO, wherein the one input signal is the first oscillatory signal; and a second ILRO of substantially identical construction to the first ILRO, having a second input lead that receives a second oscillatory signal, a third output lead and a fourth output lead that output a quadrature (Q) differential output signal, wherein the first oscillatory signal and the second oscillatory signal are a differential input signal, and wherein the in-phase (I) signal and the quadrature (Q) signal are approximately ninety degrees out of phase.

12. The frequency divider of claim 11, wherein a gain value of the first ILRO is greater than two.

13. A method comprising:

latching a voltage present on a first output node of a first Injection-locked Ring Oscillator (ILRO) to a first voltage state in response to a digital high state of a first input signal applied via a first current injection circuit comprising:

a third N-channel transistor having a source, a drain, and a gate, wherein the drain of the third N-channel transistor is coupled to a source of a first N-channel transistor of a cross-coupled transistor pair and a first lead of a first capacitor, wherein the gate of the third N-channel transistor is coupled to the first input node of the first current injection circuit; and a fourth N-channel transistor having a source, a drain, and a gate, wherein the drain of the fourth N-channel transistor is coupled to a source of a second N-channel transistor of the cross-coupled transistor pair and a second lead of the first capacitor, and wherein the gate of the fourth N-channel transistor is coupled to the first input node of the first current injection circuit, wherein a current substantially equal to a circuit supply voltage divided by a first load resistor value flows through the first N-channel transistor of the cross-coupled transistor; and toggling the voltage present on the first output node to a second voltage state in response to a digital low state of the first input signal applied via the first current injection circuit, wherein the first input signal is a sole input signal applied to the first ILRO, wherein the voltage present on the first output node is increased by integrating charge across the first capacitor.

14. The method of claim 13, wherein a circuit ground voltage and the circuit supply voltage are supplied to the first ILRO, and wherein the first voltage state is within one hundred millivolts of the circuit ground voltage and the second voltage state is within fifty millivolts of the circuit supply voltage.

15. The method of claim 13, further comprising:
latching a voltage present on a second output node of the first ILRO to the second voltage state in response to the digital high state of the first input signal applied via the first current injection circuit, wherein substantially no current flows through a second N-channel transistor of the first ILRO; and toggling the voltage present on the second output node to the first voltage state in response to the digital low state of the first input signal applied via the first current injection circuit, wherein the voltage at the second output node is decreased by integrating charge across the first capacitor.

16. The method of claim 15, wherein the first ILRO is a part of a frequency divider circuit.

17. The method of claim 15, further comprising:
receiving a differential output signal present between the first output node and the second output node of the first ILRO.

18. The method of claim 15, further comprising:
latching a voltage present on a third output node of a second ILRO and a voltage present on a fourth output node of the second ILRO in response to a digital high state of a second input signal; and toggling the voltage present on the third output node of the second ILRO and the voltage present on the fourth output node of the second ILRO in response to a digital high state of the second input signal, wherein the first input signal is approximately one hundred and eighty degrees out of phase with the second input signal.

19. The method of claim 18, further comprising:
latching a voltage present on a fifth output node of a third ILRO and a voltage present on a sixth output node of the third ILRO in response to a digital high state of a third input signal; and toggling the voltage present on the fifth output node of the third ILRO and the voltage present on the sixth output node of the third ILRO in response to a digital high state of the third input signal, wherein the fifth output node supplies the first input signal to the first ILRO and the sixth output node supplies the second input signal to the second ILRO.

20. The method of claim 18, further comprising:
inverting a voltage signal present on a third voltage node of the first ILRO, thereby generating an inverted voltage signal; and transmitting the inverted voltage signal to the first output node of the second ILRO.

21. A frequency divider circuit comprising:
means for frequency dividing a first input signal by a fixed integer thereby generating an in-phase (I) differential output signal, wherein the means includes a first capacitor, and wherein the first capacitor at least in part increases a first voltage swing of the I differential output signal, wherein the means for frequency dividing is an Injection-Locked Ring Oscillator (ILRO) comprising:
a cross-coupled transistor pair including a first N-channel transistor and a second N-channel transistor;
a first load resistor having a first lead and a second lead, wherein the first lead of the first load resistor is coupled to a first output node;
a second load resistor having a first lead and a second lead, wherein the first lead of the second load resistor is coupled to a second output node, and wherein the second lead of the first load resistor and the second lead of the second load resistor are coupled to a supply voltage node; and
a conductor that receives the first input signal onto the frequency divider circuit via a first current injection circuit comprising:
a third N-channel transistor having a source, a drain, and a gate, wherein the drain of the third N-channel transistor is coupled to a source of the first N-channel transistor of the means for frequency dividing and a first lead of the first capacitor, wherein the gate of the third N-channel transistor is coupled to the first input node of the first current injection circuit; and
a fourth N-channel transistor having a source, a drain, and a gate, wherein the drain of the fourth N-channel transistor is coupled to a source of the second N-channel transistor of the means for frequency dividing and a second lead of the first capacitor, and wherein the gate of the fourth N-channel transistor is coupled to the first input node of the first current injection circuit
wherein the ILRO is configured to drive a first output signal at the first output node from a first voltage state to a second voltage state based on only the first input signal being applied to the first ILRO, wherein the first input signal is applied to the first input node.

22. The frequency divider circuit of claim 21, further comprising:
a second conductor that receives a second input signal onto the frequency divider circuit, wherein the first input signal and the second input signal are a differential input signal, and wherein the means frequency divides the second input signal thereby generating a quadrature (Q) differential output signal, and wherein the means also includes a second capacitor, and wherein the second capacitor at least in part increases a second voltage swing of the Q differential output signal.

* * * * *